United States Patent
Maruyama et al.

(10) Patent No.: US 7,878,876 B2
(45) Date of Patent: Feb. 1, 2011

(54) LIGHT EMITTING DEVICE AND METHOD FOR PRODUCING SAME

(75) Inventors: Tsukasa Maruyama, Akita (JP); Masahiro Gotoh, Okayama (JP); Tetsuya Ikuta, Akita (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 615 days.

(21) Appl. No.: 11/690,974

(22) Filed: Mar. 26, 2007

(65) Prior Publication Data

US 2007/0228933 A1    Oct. 4, 2007

(30) Foreign Application Priority Data

Mar. 31, 2006 (JP) .............................. 2006-097083
Mar. 14, 2007 (JP) .............................. 2007-064776

(51) Int. Cl.
*H01J 9/26* (2006.01)

(52) U.S. Cl. ..................... 445/25; 445/24; 313/506; 313/509; 313/512

(58) Field of Classification Search ................. 445/24, 445/25; 313/498–512
See application file for complete search history.

(56) References Cited

U.S. PATENT DOCUMENTS 6,717,353 B1 * 4/2004 Mueller et al. .............. 313/501
2005/0184643 A1 * 8/2005 Cho et al. .................... 313/495
2005/0227569 A1 * 10/2005 Maeda et al. ................. 445/25
2005/0239227 A1 * 10/2005 Aanegola et al. ............. 438/26

FOREIGN PATENT DOCUMENTS

| JP | 2000-244021 | 9/2000 |
| JP | 2001-127346 | 5/2001 |
| JP | 2003-101081 | 4/2003 |
| JP | 2003-318447 | 11/2003 |
| JP | 2004-152993 | 5/2004 |
| WO | WO2005/029596 | 3/2005 |

* cited by examiner

*Primary Examiner*—Bumsuk Won
(74) *Attorney, Agent, or Firm*—Bachman & LaPointe, P.C.

(57) ABSTRACT

A light emitting device 10 includes: a lead frame 12a serving as a mounting portion having a cup 13; a light emitting element 14, mounted on the bottom face 13a of the cup, for emitting light having a predetermined peak wavelength; a layer of first phosphor particles 16, adsorbed and formed on the light emitting element, for absorbing light emitted from the light emitting element and for emitting light having a longer peak wavelength than that of the light emitted from the light emitting element; second phosphor particles 18 for absorbing at least one of light emitted from the first phosphor particles and light emitted from the light emitting element and for emitting light having a longer peak wavelength than that of the at least one of the light emitted from the first phosphor particles and the light emitted from the light emitting element; and a sealing member 20, in which the second phosphor particles are dispersed, for sealing the light emitting element and the layer of first phosphor particles in the cup.

4 Claims, 7 Drawing Sheets

LIGHT EMITTING DEVICE AND METHOD FOR PRODUCING SAME

BACKGROUND OF THE INVENTION

1. Field of the Invention

The present invention generally relates to a light emitting device and a method for producing the same. More specifically, the invention relates to a light emitting device wherein a light emitting element is combined with a phosphor (or a fluorescent substance) which is designed to receive light from the light emitting element to emit light having a different wavelength from that of the light emitted from the light emitting element, and a method for producing the same.

2. Description of the Prior Art

In recent years, there has been actively developed a light emitting device for emitting white light by combining a light emitting element, such as a light emitting diode (LED) for emitting light in wavelength ranges from near ultraviolet to blue, with a phosphor (or a fluorescent substance) which is designed to receive light from the light emitting element to emit light having a different wavelength from that of the light emitted from the light emitting element. In such a white light emitting device, a LED chip is mounted on the bottom face of a cup-shaped recessed portion formed in a lead frame or substrate, and a resin mixed with a phosphor, which is designed to absorb light from the LED chip to emit light having a longer wavelength than that of the light from the LED chip, is potted in the cup-shaped recessed portion to seal the LED chip therein.

If such a white light emitting device is used as a light source for illumination, it is desired that the device can emit light having a high emission power (a high illumination intensity or illuminance), a small irregularity in color, and good color rendering properties. In order to cause light from such a white light emitting device to be white light having good color rendering properties, it is proposed that a resin mixed with two kinds of phosphors for emitting light having different wavelengths by light from a LED chip is arranged around the LED chip (see, e.g., Japanese Patent Laid-Open Nos. 2000-244021, 2001-127346, 2003-101081, 2003-318447 and 2004-152993). In addition, there is proposed a light emitting device for emitting white light by arranging a resin mixed with a YAG phosphor (a rare-earth aluminate phosphor activated by a rare earth element having a garnet structure), which is designed to emit light in wavelength ranges from green to yellow as a complementary color light with respect to light in the blue range, around a light emitting element which is designed to emit light in the blue range. There is also proposed a white light emitting device capable of realizing a luminescent color having higher color rendering properties by mixing a resin with a phosphor of $Ca_2Si_5N_8$:Eu or the like which is designed to emit light in wavelength ranges from orange to red (see, e.g., WO2005/029596).

In a white light emitting device wherein a light emitting element is mounted on the bottom face of a cup-shaped recessed portion, which is formed in a lead frame or substrate, to be sealed with a resin containing phosphor particles by potting the resin, it is required that the optical path length, by which light emitted from the light emitting element passes through the resin, is constant in order to reduce the irregularity in color. In order to make it constant, it is required that the top face of a sealing member of a resin is raised to be convex so that the distance between the light emitting element and the surface of the sealing member is constant.

However, when the light emitting element arranged in the cup-shaped recessed portion is sealed with a resin by potting, it is not easy to control the shape of a sealing member of the resin so that the optical path length, by which light emitted from the light emitting element passes through the resin, is constant, due to the viscosity of the used resin and the gravity applied to the resin. As a result, the irregular color of light from the light emitting device is caused.

SUMMARY OF THE INVENTION

It is therefore an object of the present invention to eliminate the aforementioned problems and to provide a light emitting device which can reduce the irregularity in color regardless of the shape of a sealing member, and a method for producing the same.

In order to accomplish the aforementioned and other objects, according one aspect of the present invention, there is provided a method for producing a light emitting device, the method comprising the steps of: preparing a light emitting element for emitting light having a predetermined peak wavelength; preparing first phosphor particles for absorbing light emitted from the light emitting element and for emitting light having a longer peak wavelength than that of the light emitted from the light emitting element; preparing said second phosphor particles for absorbing at least one of light emitted from the first phosphor particles and light emitted from the light emitting element and for emitting light having a longer peak wavelength than that of the at least one of the light emitted from the first phosphor particles and the light emitted from the light emitting element; causing the first phosphor particles to be adsorbed on the surface of the light emitting element to form a layer of the first phosphor particles thereon; and sealing the light emitting element and the first phosphor particles by means of a sealing member containing the second phosphor particles.

In this method for producing a light emitting device, the first phosphor particles are preferably adsorbed by electrostatic adsorption. Preferably, the light emitting element is a light emitting element for emitting light having a peak wavelength in the wavelength range of from 420 nm to less than 490 nm, the first phosphor particles are phosphor particles for emitting light having a peak wavelength in the wavelength range of from 490 nm to less than 590 nm, and the second phosphor particles are phosphor particles for emitting light having a peak wavelength in the wavelength range of from 590 nm to 780 nm. The second phosphor particles are preferably dispersed in the sealing member.

According to another aspect of the present invention, a light emitting device comprises: a mounting portion having a recessed portion; a light emitting element, mounted on a bottom face of the recessed portion of the mounting portion, for emitting light having a predetermined peak wavelength; a layer of first phosphor particles, formed on the light emitting element, for absorbing light emitted from the light emitting element and for emitting light having a longer peak wavelength than that of the light emitted from the light emitting element; second phosphor particles for absorbing at least one of light emitted from the first phosphor particles and light emitted from the light emitting element and for emitting light having a longer peak wavelength than that of the at least one of the light emitted from the first phosphor particles and the light emitted from the light emitting element; and a sealing member, in which the second phosphor particles are dispersed, for sealing the light emitting element and the layer of first phosphor particles in the recessed portion of the mounting portion, wherein a difference between the maximum and minimum values of correlated color temperatures is not greater than 500K when the correlated color temperatures of light emitted from the surface of the sealing member are measured every 10° in the range of from 10° to 170° with respect to the tangent plane at the center of the surface of the sealing member. If the difference between the maximum and minimum values of correlated color temperatures is not greater than 500K, it is possible to emit uniform white light in various directions, so that the light emitting device can be used as a light source for illumination.

Preferably, in this light emitting device, the light emitting element is a light emitting element for emitting light having a peak wavelength in the wavelength range of from 420 nm to less than 490 nm, the first phosphor particles are phosphor particles for emitting light having a peak wavelength in the wavelength range of from 490 nm to less than 590 nm, and the second phosphor particles are phosphor particles for emitting light having a peak wavelength in the wavelength range of from 590 nm to 780 nm. The light emitting device preferably has a general color rendering index Ra of not less than 90. If the general color rendering index Ra is not less than 90, when an object is irradiated with light emitted from the light emitting device, the color of the object visible by viewers approaches the color of the object visible by viewers when the object is irradiated with sunlight, and the color reproducibility is good, so that the light emitting device is suitable for a light source for illumination.

According to the present invention, it is possible to produce a light emitting device which can reduce the irregularity in color regardless of the shape of a sealing member.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiment of a light emitting device and a method for producing the same according to the present invention will be described below in detail.

Figure 1:
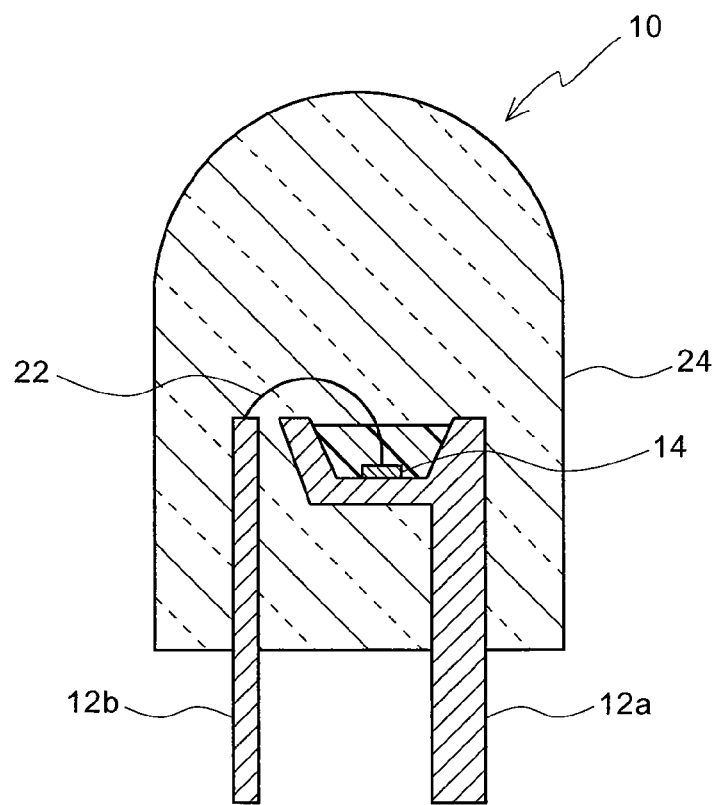
FIG. 1 is a sectional view schematically showing the preferred embodiment of a light emitting device according to the present invention.
Figure 2:
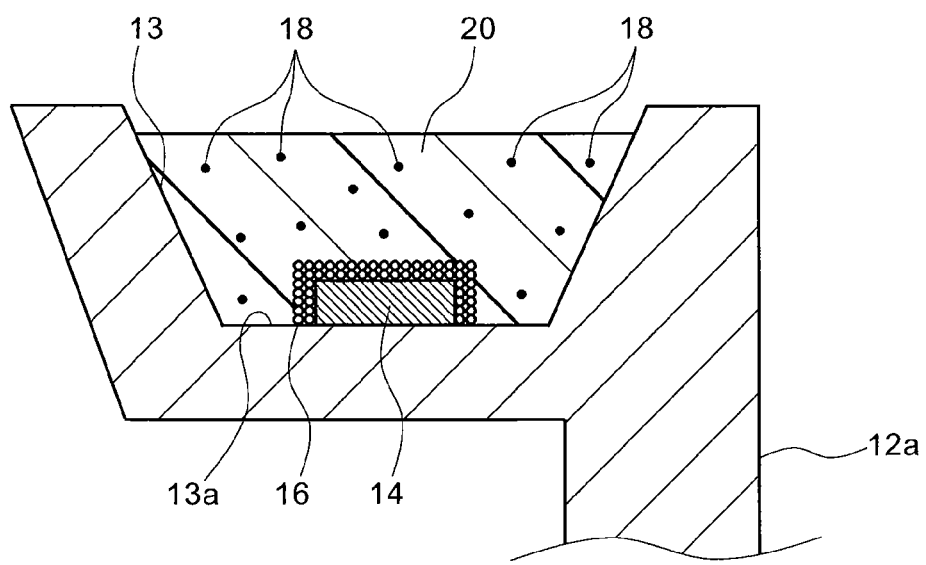
FIG. 2 is an enlarged sectional view of a cup portion of one lead frame on which a light emitting element of the light emitting device of FIG. 1 is mounted.

FIG. 1 is a sectional view schematically showing the preferred embodiment of a light emitting device according to the present invention, and FIG. 2 is an enlarged sectional view of a cup portion of one of a pair of lead frames, on which a light emitting element of the light emitting device of FIG. 1 is mounted. As shown in FIGS. 1 and 2, the light emitting device 10 in this preferred embodiment comprises: a pair of lead frames 12a and 12b arranged at an interval; a light emitting element 14 which is mounted on the bottom face 13a of a cup (recessed portion) 13 formed in the tip end portion of one lead frame 12a; first phosphor particles 16 which are arranged so as to cover the surface of the light emitting element 14; a sealing member 20 containing second phosphor particles 18, which is filled in the cup 13 of the lead frame 12a so as to cover the first phosphor particles 16; and a transparent mold member 24 which covers the tip end portions of the lead frames 12a and 12b.

Furthermore, the bottom face of the light emitting element 14 has one of a pair of electrodes (not shown), e.g., an Au—Sn electrode, and the top face of the light emitting element 14 has the other electrode, e.g., an Au electrode. The electrode of the bottom face of the light emitting element 14 is electrically connected to the bottom face 13a of the cup 13 of the one lead frame 12a by die bonding, and the electrode of the top face of the light emitting element 14 is electrically connected to the other lead frame 12b by a conductive wire 22, such as a gold wire.

The light emitting element 14 may be a blue LED chip of, e.g., a semiconductor crystal of gallium nitride, which is capable of emitting visible light having a peak wavelength of 420 to 490 nm in the blue or violet range. However, the LED chip capable of being used as the light emitting element 14 of a light emitting device according to the present invention should not be limited to the blue LED chip, but may be a light emitting element capable of emitting an ultraviolet light or a near-ultraviolet light. As the light emitting element 14, a LED chip having a substantially square planar shape of 0.3 to 1 square millimeters may be generally used.

If the light emitting element 14 emits light in the blue range, the first phosphor particles 16 are preferably made of a material for emitting light in wavelength ranges from green to yellow, which have the function of enhancing luminance, in order to improve luminance. The first phosphor particles 16 are preferably green phosphor particles in order to further enhance color rendering properties. In addition, the first phosphor particles 16 and the second phosphor particles 18 are preferably made of materials for emitting light, which is white light when being observed from the outside, if the materials are combined with the light emitting element 14. The mean particle diameter of the first phosphor particles 16 and second phosphor particles is preferably in the range of from about 1 µm to about 50 µm. The lead frame 12 is preferably made of a metal, such as copper, a copper-zinc alloy or an iron-nickel alloy. The material of the sealing member 20 may be a transparent or translucent resin material, such as an epoxy resin or silicon resin, or a glass material. It is preferably a silicon resin in view of heat resistance, ultraviolet resistance and workability.

If the second phosphor particles 18 are dispersed in the sealing member 20 so as to be apart from the light emitting device 14 as the light emitting device 10 in this preferred embodiment, even if the amount of the second phosphor particles 18 is small, light directly entering the second phosphor particles 18 from the light emitting element 14, as well as light scattered by the first phosphor particles 16 surrounding the light emitting element 14, enter the second phosphor particles 18 to increase the probability that the second phosphor particles 18 are excited, so that it is possible to increase the quantity of emission of the second phosphor particles 18. In addition, light emitted from the light emitting element 14 at all angles can be mixed with light from the second phosphor particles 18, so that it is possible to greatly decrease the irregularity in color.

The light emitting device 10 in this preferred embodiment with the above described construction may be produced as follows.

First, one side of the light emitting element 14 is die-bonded (bonded and fixed) to the bottom face 13a of the cup 13 of the one lead frame 12a by means of a die bonder (not shown) to electrically connect one electrode of the light emitting element 14 to the one lead frame 12a. After the die bonding, the pair of lead frames 12a and 12b are conveyed to a wire bonder (not shown), and the other electrode of the light emitting element 14 is wire-bonded to the other lead frame 12b by means of the conductive wire 22, such as a gold wire, to be electrically connected thereto.

Figure 3:
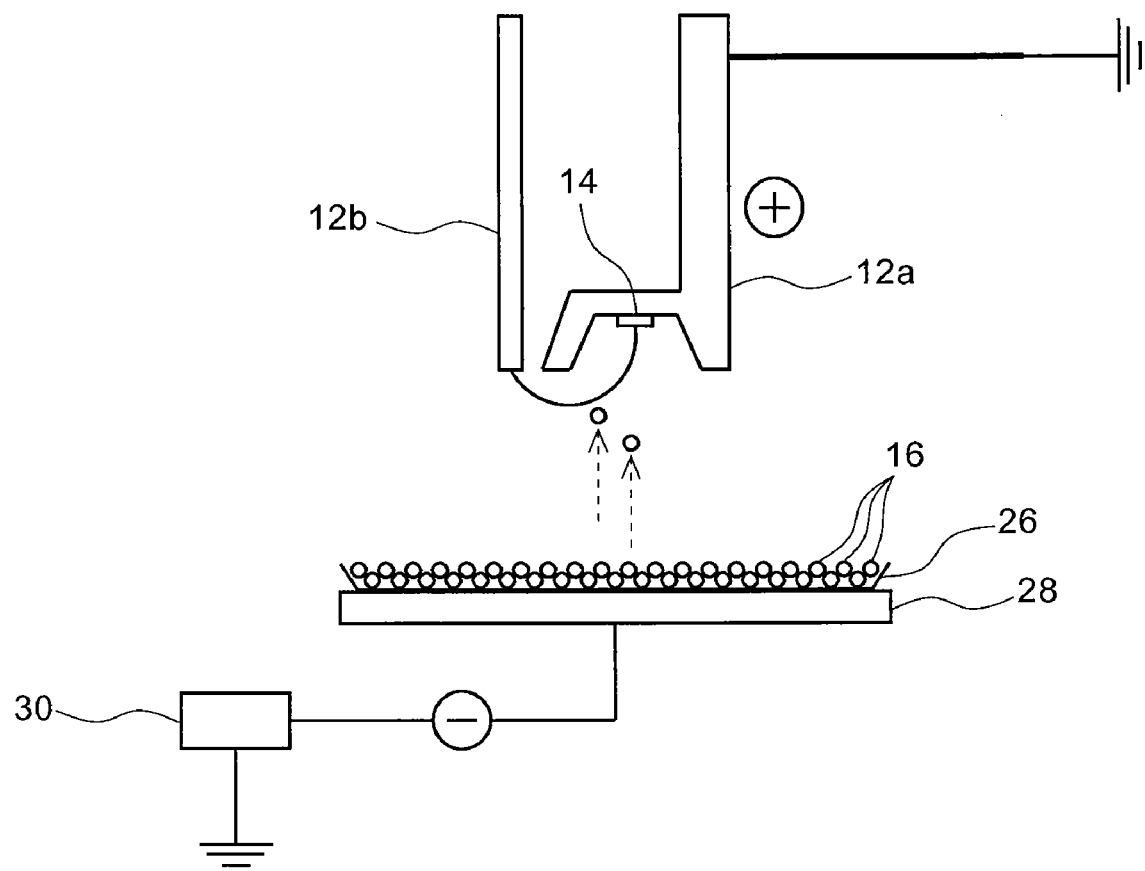
FIG. 3 is an illustration for explaining an electrostatic adsorption process for first phosphor particles in the preferred embodiment of a method for producing a light emitting device according to the present invention.

Then, the pair of lead frames 12a and 12b are conveyed to an electrostatic adsorber and the first phosphor particles 16 are electrostatically adsorbed on the surface of the light emitting element 14, which is die-bonded to the cup 13 of the lead frame 12a, to uniformly form a wavelength converting layer of the first phosphor particles 16 on the surface of the light emitting element 14. That is, as shown in FIG. 3, after the first phosphor particles 16 are put on a metal tray 26 which is arranged on a metal plate 28, the lead frames 12a and 12b are arranged above the metal tray 26 by 10 mm so that the opening of the cup 13 of the lead frame 12a faces the metal tray 26, and the lead frame 12a is grounded by wiring. Then, a voltage of −10 kV is applied to the metal plate 28 by means of a direct voltage source 30 to produce a potential difference of 10 kV between the metal plate 28 and the lead frame 12a. Thus, the first phosphor particles 16 on the metal tray 26 arranged on the metal plate 28 are charged to be negative, so that the negative particles are allowed to be adsorbed on the positively charged light emitting element 14. Thus, a layer of the first phosphor particles 16 is formed on the light emitting element 14 in the cup 13 until the layer has such a thickness that a target color temperature is obtained by the electrostatic adsorption. In the electrostatic adsorption, in order to prevent color temperature from being changed in accordance with observation angles, i.e., in order to make color temperature uniform even if the observation angle is changed, the layer of the first phosphor particles 16 for emitting light having the function of enhancing luminance is formed on the surface of the light emitting element 14 so as to have a constant thickness. Furthermore, while the first phosphor particles 16 have been electrostatically adsorbed on the surface of the light emitting element 14 in this preferred embodiment, another adsorbing method may be used if the first phosphor particles 16 can be formed on the surface of the light emitting element 14 so as to have a constant thickness.

Then, the pair of lead frames 12a and 12b are conveyed to a molding machine (not shown), and the second phosphor particles 18 and the sealing member 20 are injected into the cup 13 of the lead frame 12a by means of the dispenser of the molding machine. Thus, the first phosphor particles 16 are held by the sealing member 20 in which the second phosphor particles 18 are dispersed. When phosphor particles for emitting light in the yellow range are used as the first phosphor particles 16 and when phosphor particles for emitting light in the red range are used as the second phosphor particles 18, if the amount of the second phosphor particles 18 is about 1 to 20% by weight with respect to the amount of the first phosphor particles 16, the most part of phosphor particles to be used are the first phosphor particles 16 for emitting light in the yellow range. Since the layer of the first phosphor particles 16 can be formed so as to have a constant thickness, it is possible to reduce the irregularity in color caused by the difference in distance, by which light from the light emitting element 14 passes through the layer of the phosphor particles. If the second phosphor particles 18 for emitting light in the red range are mixed with the resin to be applied around the first phosphor particles 16, which are adsorbed on the surface of the light emitting element 14 and which are designed to emit light in the yellow range, it is possible to finely control the amount of the second phosphor particles 18 to be applied, so that it is possible to control color temperature and color rendering properties.

Finally, after the lead frames 12a and 12b are soaked in a molding flask (not shown) into which a molding material is previously injected, the molding flask is removed to cure the resin, so that it is possible to produce a shell-shaped light emitting device as shown in FIG. 1.

Thus, the optical path length, by which light emitted from the light emitting element 14 passes through the first phosphor particles 16 having the function of enhancing luminance, can be constant, and the quantity of wavelength converted light in the layer of the first phosphor particles 16 serving as a wavelength converting layer can be constant, so that it is possible to produce a light emitting device for emitting white light having no irregular color. In addition, the amount of the second phosphor particles 18 added to the resin can be decreased to uniformly disperse the second phosphor particles 18 in the resin, so that it is also possible to improve color rendering properties.

Examples of a light emitting device and a method for producing the same according to the present invention will be described below in detail.

EXAMPLE

First, a blue LED chip (having an active layer of InGaN and a luminous peak wavelength of 460 nm) serving as the light emitting element 14 was arranged in the cup 13 of one lead frame 12a to be die-bonded, and wire-bonded. In addition, phosphor particles having a mean particle diameter ($D_{50}$) of 10 μm and expressed as $SrAl_{(1+x)}Si_{(4-x)}O_xN_{(7-x)}:Ce$ ($0 \leq x \leq 1$, x=0.45) (green phosphor particles of $SrAl_{1.45}Si_{3.55}O_{0.45}N_{6.55}:Ce$) (having a luminous peak wavelength of 557 nm) were prepared as the first phosphor particles 16. Then, as shown in FIG. 3, after the first phosphor particles 16 were put on the metal tray 26 which was arranged on the metal plate 28, the lead frame 12a was arranged above the metal tray 26 by 10 mm so that the opening of the cup 13 of the lead frame 12a faced the metal tray 26, and the lead frame 12a was grounded by wiring. Then, a voltage of −10 kV was applied to the metal plate 28 to produce a potential difference of 10 kV between the metal plate 28 and the lead frame 12a. Thus, the first phosphor particles 16 on the metal tray 26 arranged on the metal plate 28 are charged to be negative, so that the negative particles were allowed to be adsorbed on the positively charged blue LED chip 14. Thus, a layer of the first phosphor particles 16 was formed on the blue LED chip 14 in the cup 13 by the electrostatic adsorption until the layer had a thickness required for obtaining a target color temperature.

In addition, red phosphor particles of $CaAlSiN_3$:Eu having a mean particle diameter ($D_{50}$) of 7 μm (having a luminous peak wavelength of 659 nm) were prepared as the second phosphor particles 18. The second phosphor particles 18 and a precipitation inhibitor of $SiO_2$ having a particle diameter of 7 nm were mixed with a silicon resin (SCR-1011 produced by Shin-Etsu Chemical Co., Ltd.) having a viscosity of 350 mPa·s to be potted into the cup 13 of the lead frame 12a to seal the first phosphor particles 16 with the sealing member 20 in which the second phosphor particles 18 were dispersed. The amount of the second phosphor particles 19 mixed in the resin was 5% by weight with respect to 95% by weight of the first phosphor particles 16.

Figure 4:
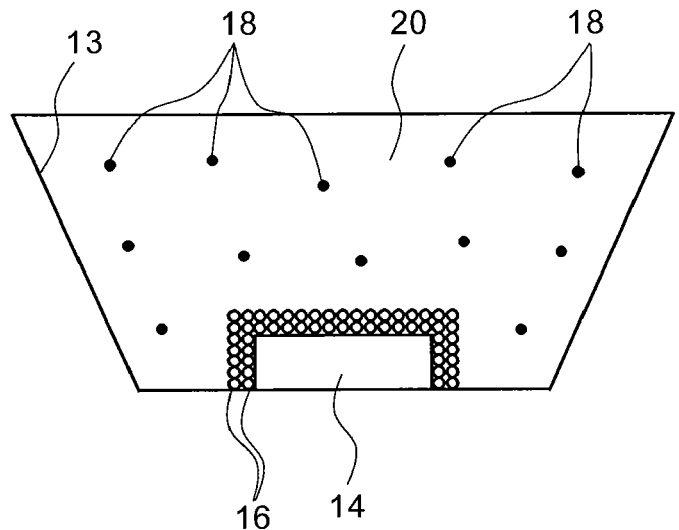
FIG. 4 is an illustration for explaining the structure in a cup of a lead frame of a light emitting device in Example.
Figure 11:
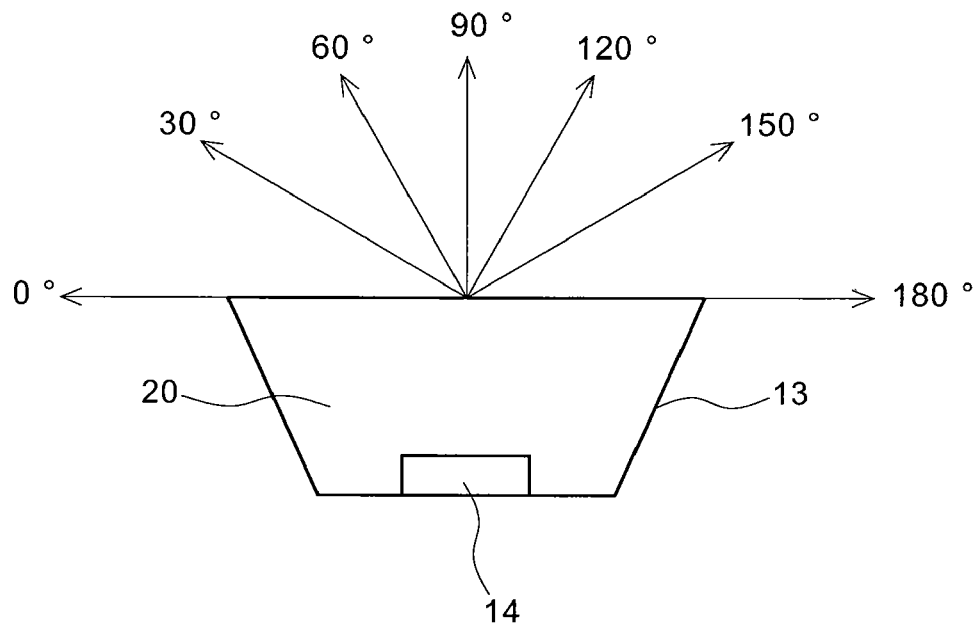
FIG. 11 is an illustration for explaining the observation angle for correlated color temperature.

Thus, a light emitting device having the structure in the cup 13 shown in FIG. 4 was produced, and the color rendering index of the light emitting device was measured. In addition, in order to evaluate the irregularity in color (color temperature distribution) of the light emitting device, the correlated color temperature thereof was measured with respect to observation angles on the basis of JIS Z8726. That is, since the irregularity in color increases if light emitted from the light emitting device is visible as a different light in accordance with angles at which a viewer is arranged, it is possible to evaluate the irregularity in color if correlated color temperatures are measured with respect of various observation angles to obtain the difference between the maximum and minimum values thereof (color temperature range). As shown in FIG. 11, the measurement of the correlated color temperature with respect to observation angles was carried out by measuring the correlated color temperature of light, which was emitted from the surface of the sealing member 20, every 10° in the range of from 10° to 170° with respect to the tangent plane at the center of the surface of the sealing member 20. Furthermore, the correlated color temperature was measured on the basis of JIS Z8725 by transmitting light, which was irradiated on a detecting element being apart from the light emitting device by 1.4 to 1.5 m, to a measuring apparatus (PMA-11 (C7473-36) produced by Hamamatsu Photonics Co., Ltd.) via an optical fiber.

Figure 5:
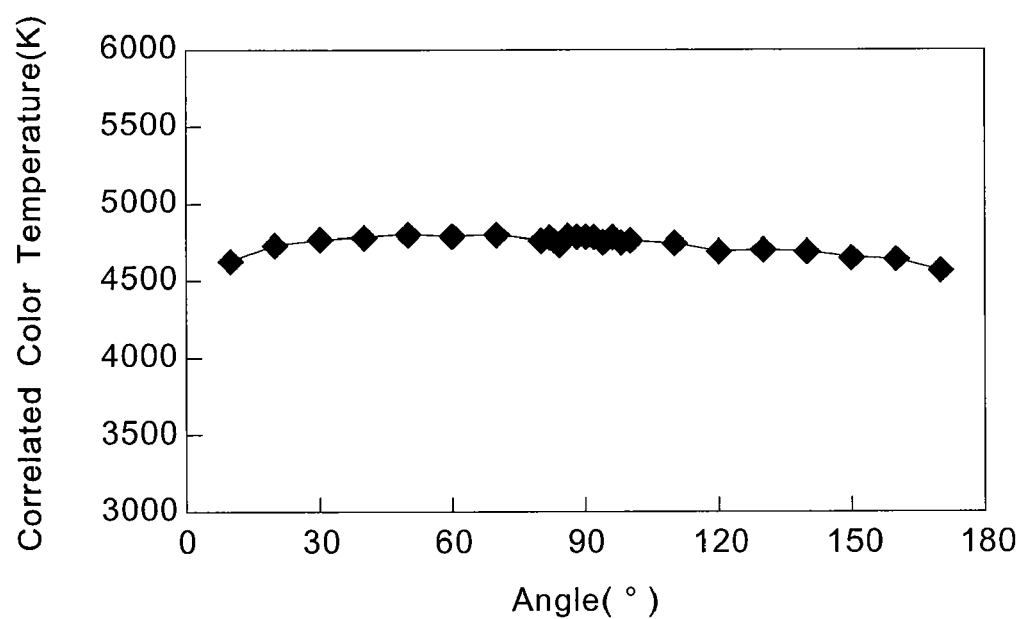
FIG. 5 is a graph showing the relationship between the observation angle and correlated color temperature of the light emitting device in Example.
Figure 6:
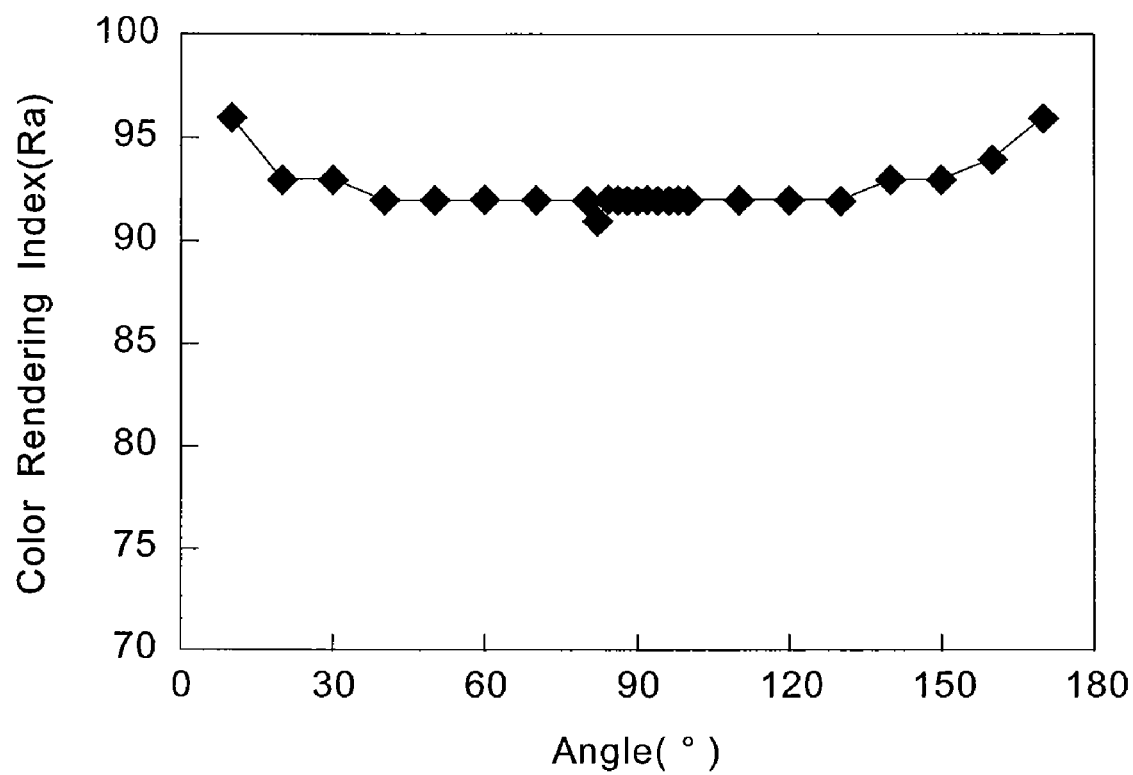
FIG. 6 is a graph showing the relationship between the observation angle and color rendering index of the light emitting device in Example.
Figure 12:
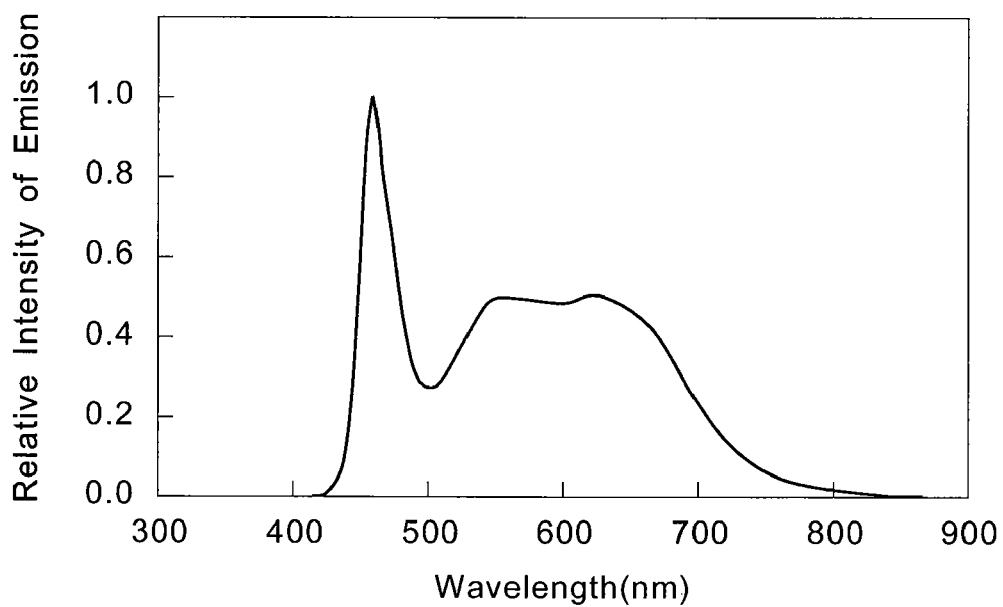
FIG. 12 is a graph showing emission spectrum at the observation angle of 90° in the light emitting device in Example.

As a result, as shown in FIG. 5 and Table 1, the correlated color temperature at the observation angle of 90° was about 4800K, and the color temperature range was 233 K, so that the irregularity in color was very small. The general color rendering index Ra at the observation angle of 90° was a high value of 90, and color rendering properties were good, so that the color reproducibility was good. As shown in Table 2, special color rendering indexes R9-R15 were not less than 60, so that the colors of materials being visible by viewers approach those in the presence of sunlight. Thus, the light emitting device produced in Example was preferred. In particular, the color reproducibility with respect to red was good since R9 was a high value of 95, and the color reproducibility with respect to the skin color of Japanese was good since R15 was a high value of 91. Therefore, the light emitting device in Example can be used as an excellent light source for illumination. Moreover, as shown in FIG. 6 and Table 3, the variation in general color rendering index Ra with respect to observation angles was very small, and the color rendering index at an observation angle of 10 to 170° was a high value of not less than 90. Furthermore, if an object is placed under an illumination device which uses a light emitting device having a large variation in general color rendering index Ra, the color of the object is viewed so as to be changed in accordance with angles of light from the illumination device. However, in the case of a light emitting device having a small variation in general color rendering index Ra, the degree of the variation in color of the object viewed in accordance with angles of light from the illumination device is decreased. Furthermore, FIG. 12 shows the results (emission spectrum) of measured intensities of emission with respect to wavelengths at the observation angle of 90° in the light emitting device in this example.

TABLE 1

| angle (°) | Correlated Color Temperature (K) | | |
|---|---|---|---|
| | Example | Comp. 1 | Comp. 2 |
| 10 | 4634 | 4376 | 4501 |
| 20 | 4731 | 4659 | 4712 |
| 30 | 4772 | 4743 | 4951 |
| 40 | 4785 | 4887 | 4982 |
| 50 | 4800 | 4955 | 5002 |
| 60 | 4786 | 5031 | 5051 |
| 70 | 4799 | 5073 | 5081 |
| 80 | 4759 | 5148 | 5145 |
| 82 | 4776 | 5145 | 5137 |
| 84 | 4733 | 5154 | 5141 |
| 86 | 4788 | 5142 | 5155 |
| 88 | 4781 | 5163 | 5183 |
| 90 | 4779 | 5145 | 5201 |
| 92 | 4778 | 5158 | 5184 |
| 94 | 4753 | 5154 | 5162 |
| 96 | 4778 | 5174 | 5154 |
| 98 | 4745 | 5158 | 5145 |
| 100 | 4763 | 5142 | 5133 |
| 110 | 4741 | 5085 | 5095 |
| 120 | 4695 | 5037 | 5042 |
| 130 | 4696 | 4930 | 4957 |
| 140 | 4688 | 4833 | 4886 |
| 150 | 4647 | 4710 | 4804 |
| 160 | 4644 | 4557 | 4717 |
| 170 | 4567 | 4296 | 4551 |

TABLE 2

| Special Color Rendering Index | | | | | | | | | | | | | | | |
|---|---|---|---|---|---|---|---|---|---|---|---|---|---|---|---|
| R1 | R2 | R3 | R4 | R5 | R6 | R7 | R8 | R9 | R10 | R11 | R12 | R13 | R14 | R15 | R16 |
| 95 | 90 | 90 | 83 | 92 | 88 | 85 | 89 | 95 | 86 | 81 | 66 | 93 | 96 | 91 | 54 |

TABLE 3

| angle (°) | Color Rendering Index |
| --- | --- |
| 10 | 96 |
| 20 | 93 |
| 30 | 93 |
| 40 | 92 |
| 50 | 92 |
| 60 | 92 |
| 70 | 92 |
| 80 | 92 |
| 82 | 91 |
| 84 | 92 |
| 86 | 92 |
| 88 | 92 |
| 90 | 92 |
| 92 | 92 |
| 94 | 92 |
| 96 | 92 |
| 98 | 92 |
| 100 | 92 |
| 110 | 92 |
| 120 | 92 |
| 130 | 92 |
| 140 | 93 |
| 150 | 93 |
| 160 | 94 |
| 170 | 96 |

Comparative Example 1

The same first phosphor particles 16 and the same second phosphor particles 18 as those in Example were prepared to be mixed in the same silicon resin as that in Example. Then, similar to Example, the resin was potted in the cup 13 of the lead frame 12a to seal the light emitting element 14 with the sealing member 20 containing the first phosphor particles 16 and second phosphor particles 18.

Figure 7:
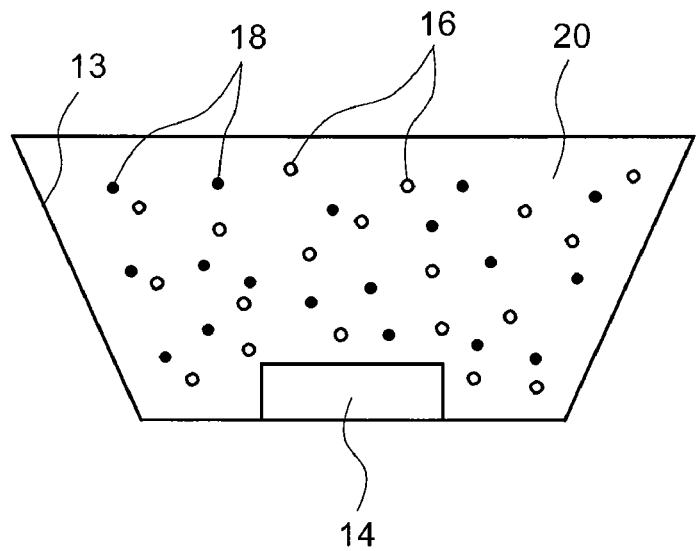
FIG. 7 is an illustration for explaining the structure in a cup of a lead frame of a light emitting device in Comparative Example 1.
Figure 8:
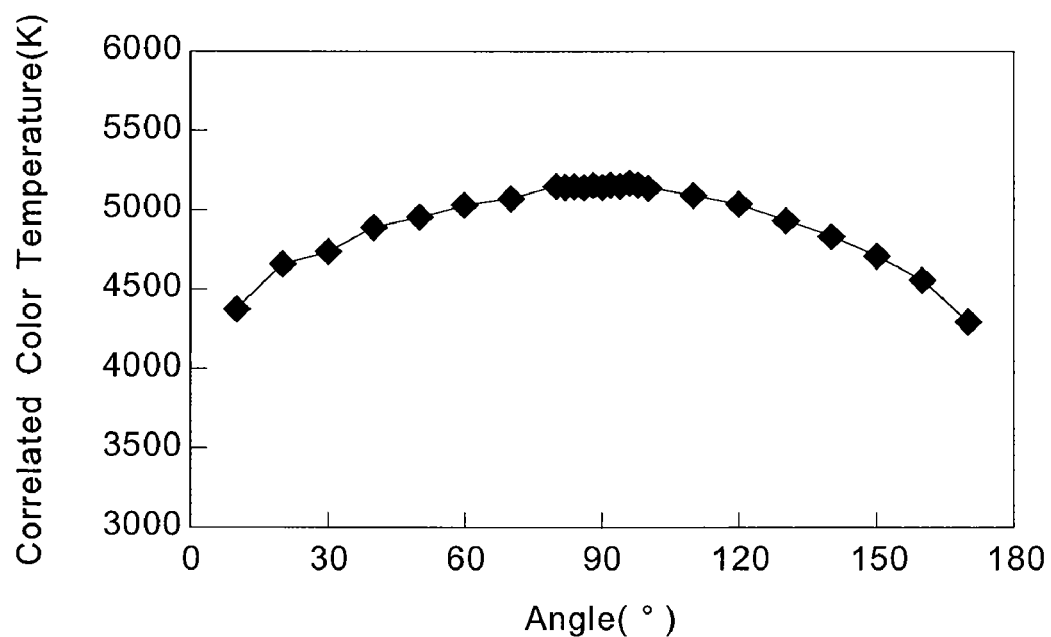
FIG. 8 is a graph showing the relationship between the observation angle and correlated color temperature of the light emitting device in Comparative Example 1.

Thus, a light emitting device having the structure in the cup 13 shown in FIG. 7 was produced. With respect to the light emitting device thus produced, the color rendering index and the correlated color temperatures with respect to observation angles were measured. As a result, the general color rendering index Ra was 92, so that color rendering properties were good. However, as shown in FIG. 8 and Table 1, the correlated color temperature at the observation angle of 90° was about 5150K, and the color temperature range was 878K, so that the irregularity in color was large.

Comparative Example 2

Figure 9:
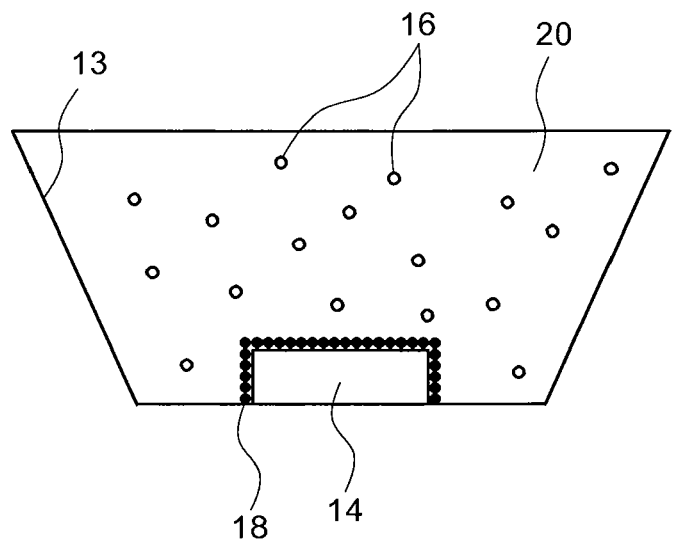
FIG. 9 is an illustration for explaining the structure in a cup of a lead frame of a light emitting device in Comparative Example 2.

A light emitting device having the structure in the cup 13 shown in FIG. 9 was produced by the same method as that in Example, except that the second phosphor particles 18 in Example were used in place of the first phosphor particles 16 in Example, and that the first phosphor particles 16 in Example were used in place of the second phosphor particles in Example.

Figure 10:
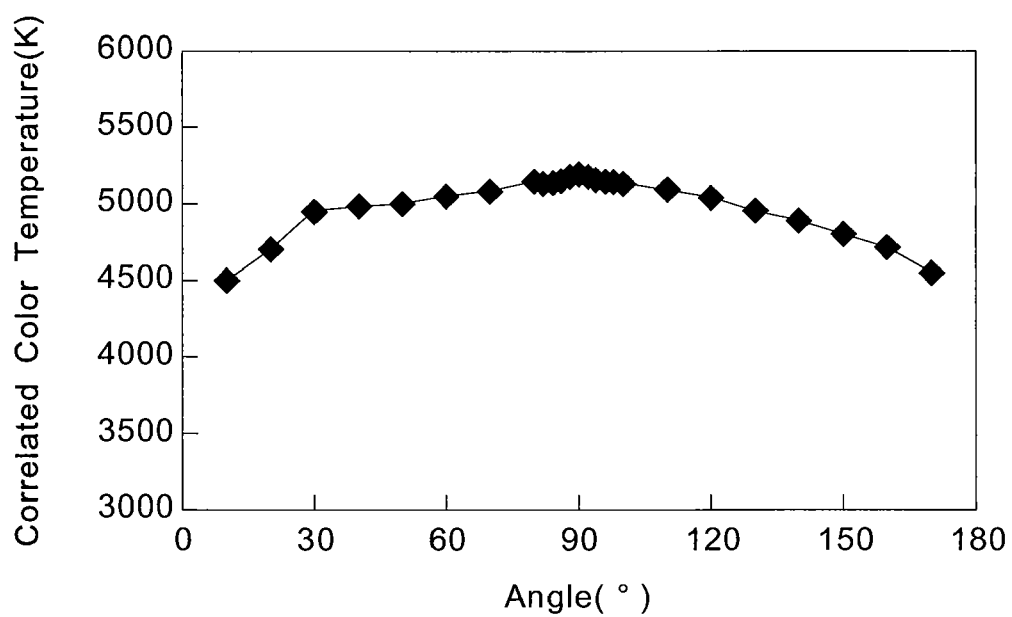
FIG. 10 is a graph showing the relationship between the observation angle and correlated color temperature of the light emitting device in Comparative Example 2.

With respect to the light emitting device thus produced, the color rendering index and the correlated color temperatures with respect to observation angles were measured. As a result, the general color rendering index Ra was 92, so that color rendering properties were good. However, as shown in FIG. 10 and Table 1, the correlated color temperature at the observation angle of 90° was about 5200K, and the color temperature range was 700K, so that the irregularity in color was large.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for producing a light emitting device, the method comprising the steps of:
    preparing a light emitting element of a semiconductor crystal for emitting light having a predetermined peak wavelength;
    preparing first phosphor particles for absorbing light emitted from the light emitting element and for emitting light having a longer peak wavelength than that of the light emitted from the light emitting element;
    preparing second phosphor particles for absorbing at least one of light emitted from the first phosphor particles and light emitted from the light emitting element and for emitting light having a longer peak wavelength than that of said at least one of the light emitted from the first phosphor particles and the light emitted from the light emitting element;
    bonding one side of the light emitting element to the bottom face of a cup of one of a pair of lead frames of a metal;
    putting the first phosphor particles on a metal tray;
    arranging the light emitting element, which is bonded to the bottom face of the cup of the one of the pair of lead frames, above the first phosphor particles, which are put on the metal tray, so as to face the first phosphor particles;
    charging the light emitting element, which is arranged above the first phosphor particles, to be positive while charging the first phosphor particles to be negative to cause the first phosphor particles to be electrostatically adsorbed on the surface of the light emitting element to form a layer of the first phosphor particles thereon; and
    sealing the light emitting element and the first phosphor particles by means of a sealing member containing the second phosphor particles.

2. A method for producing a light emitting device as set forth in claim 1, wherein said light emitting element is a light emitting element for emitting light having a peak wavelength in the wavelength range of from 420 nm to less than 490 nm, said first phosphor particles are phosphor particles for emitting light having a peak wavelength in the wavelength range of from 490 nm to less than 590 nm, and said second phosphor particles are phosphor particles for emitting light having a peak wavelength in the wavelength range of from 590 nm to 780 nm.

3. A method for producing a light emitting device as set forth in claim 1, wherein said second phosphor particles are dispersed in said sealing member.

4. A method for producing a light emitting device, the method comprising the steps of:
    preparing a light emitting element of a semiconductor crystal for emitting light having a predetermined peak wavelength;
    preparing first phosphor particles for absorbing light emitted from the light emitting element and for emitting light having a longer peak wavelength than that of the light emitted from the light emitting element;
    preparing second phosphor particles for absorbing at least one of light emitted from the first phosphor particles and light emitted from the light emitting element and for emitting light having a longer peak wavelength than that of said at least one of the light emitted from the first phosphor particles and the light emitted from the light emitting element;

die-bonding one side of the light emitting element to the bottom face of a cup of one of a pair of lead frames of a metal to electrically connect one electrode of the light emitting element to the one of the pair of lead frames;

wire-bonding the other electrode of the light emitting element to the other of the pair of lead frames to electrically connect the other electrode thereto;

putting the first phosphor particles on a metal tray;

arranging the light emitting element, which is die-bonded to the bottom face of the cup of the one of the pair of lead frames, above the first phosphor particles, which are put on the metal tray, so as to face the first phosphor particles;

charging the light emitting element, which is arranged above the first phosphor particles, to be positive while charging the first phosphor particles to be negative to cause the first phosphor particles to be electrostatically adsorbed on the surface of the light emitting element to form a layer of the first phosphor particles thereon; and sealing the light emitting element and the first phosphor particles by means of a sealing member containing the second phosphor particles.

* * * * *